United States Patent [19]

Ooshima et al.

[11] Patent Number: 4,835,774
[45] Date of Patent: May 30, 1989

[54] SEMICONDUCTOR MEMORY TEST SYSTEM

[75] Inventors: Hiromi Ooshima, Saitama; Masao Shimizu; Junji Nishiura, both of Gyoda, all of Japan

[73] Assignee: Advantest Corporation, Saitama, Japan

[21] Appl. No.: 51,399

[22] Filed: May 19, 1987

[30] Foreign Application Priority Data

May 19, 1986 [JP] Japan .................. 61-114381

[51] Int. Cl.$^4$ ............................................. G06F 11/00
[52] U.S. Cl. .................................. 371/25; 371/21
[58] Field of Search ............... 371/21, 25, 27, 68; 365/201

[56] References Cited

U.S. PATENT DOCUMENTS 3,544,777 12/1970 Winkler ........................ 371/25 X
4,369,511 1/1983 Kimura ........................ 371/25 X
4,370,746 1/1983 Jones .......................... 371/25 X Primary Examiner—Jerry Smith
Assistant Examiner—Robert W. Beausoliel
Attorney, Agent, or Firm—Staas & Halsey

[57] ABSTRACT

In a semiconductor test system, higher accuracy testing of semiconductor memories is achieved by providing test data from a modified pattern generator to identical addresses in both the memory under test and a buffer memory. This is achieved for various types of semiconductor memories by treating data generated by the modified pattern generator for the memory under tests in ways that would correspond to how the data is treated in various memories to be tested before storing the data in the buffer memory. This is accomplished using a variety of multiplexers and counters under control of a control signal generator. Data stored at locations with the same address in both memories is read out for comparison in a logic comparator. If the data is not identical, the semiconductor memory under test is rejected as defective.

4 Claims, 7 Drawing Sheets

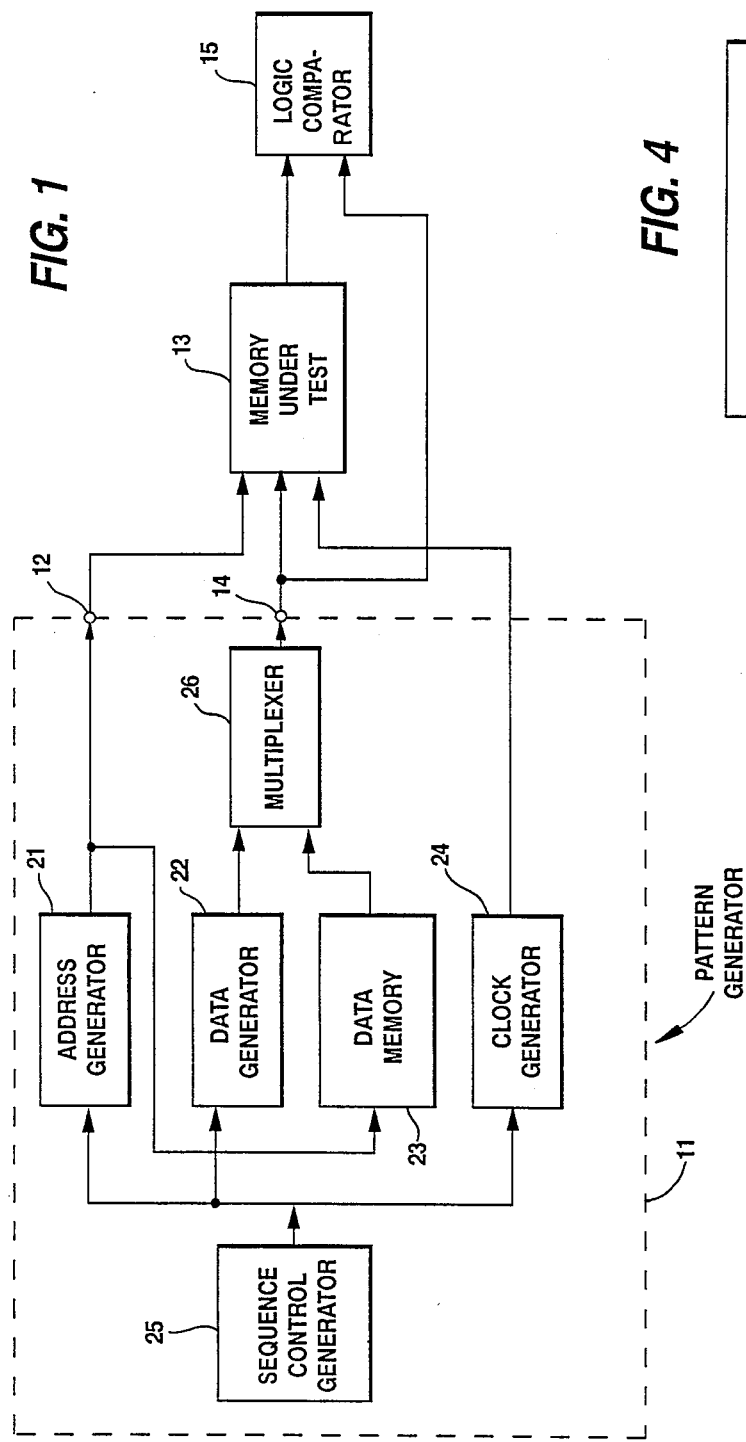
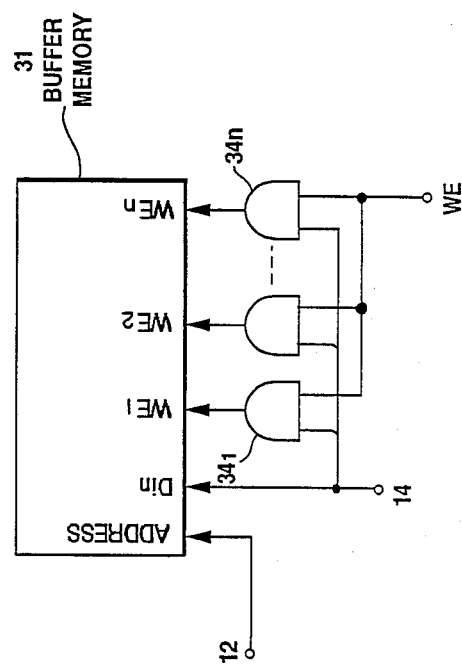
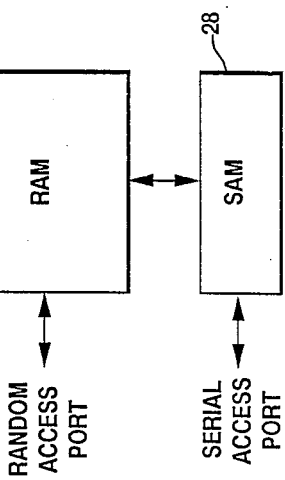

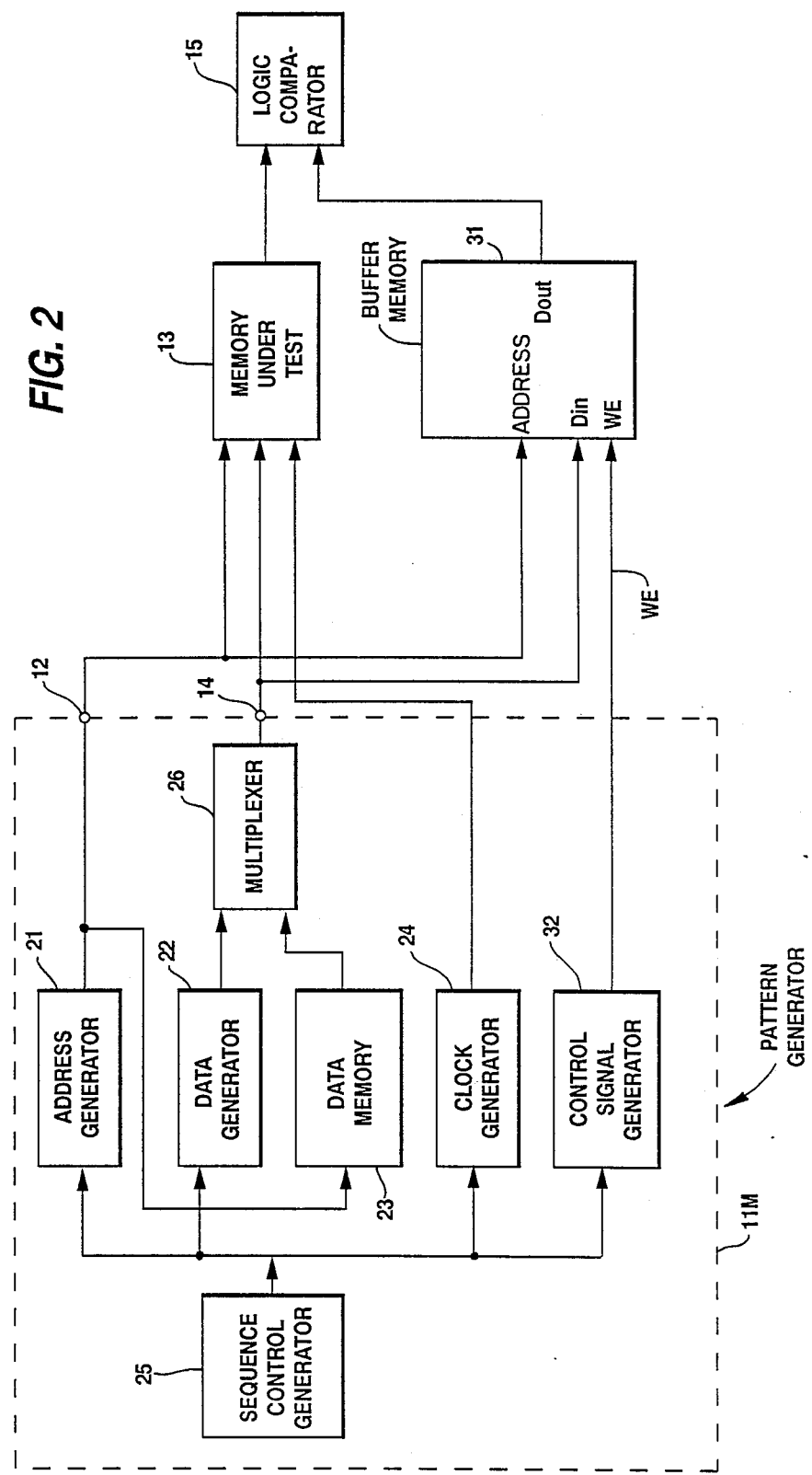

SEMICONDUCTOR MEMORY TEST SYSTEM

BACKGROUND OF THE INVENTION

This invention relates to a semiconductor memory test system which is capable of testing semiconductor memories by providing address signals and write-in data to the memories under test from a pattern generator, reading out the stored data from the memories under test, and comparing this read-out data with expected data.

FIG. 1 is a block diagram of one example of a conventional semiconductor memory test system 20. According to this system, an address signal is supplied to a memory 13 that is to be tested from an address terminal 12, and data generated by a conventional pattern generator 11 is written-in to this address of the memory 13 via a data terminal 14. After that, the data in the memory 13 is read out to a logic comparator 15, and the readout data is then compared with expected data in the logic comparator 15 to determine whether the memory 13 works correctly or not.

The conventional pattern generator 11 is composed of an address generator 21, a data generator 22, a data memory 23, a clock generator 24, and a sequence control unit 25. The sequence control unit 25 controls the address generator 21, the data generator 22, and the clock generator 24. The address generator 21 generates address signals that are supplied to the memory 13. The data generator 22 generates data to be written into the memory 13 and expected data to be supplied to the logic comparator 15.

Similarly to the data generator 22, the data memory 23 generates write data to be supplied to the memory 13 and the expected data to be outputted to the logic comparator 15. The data generator 22 is utilized for sequential and/or repeatable data generation but the data memory 23 is utilized for irregular or random data generation. A multiplexer 26 selects to output data from the data generator 22 or from the data memory 23 and provides it to the data terminal 14.

In a conventional semiconductor memory test system, such as the one illustrated in FIG. 1, there are several disadvantages, as described below.

(a) One type of memory is capable of inhibiting the writing-in procedure for arbitrary selected bits. In this memory, supplied data is written into the bits which are not inhibited, whereas the previously stored data remains in the bits for which writing-in is inhibited. For testing this type of memory, the expected data must be determined from the combination of data in the memory before write-in, supplied data, and mask data, which determines the inhibited bits. However, since there are many variations of combinations possible, generating the expected data is not possible in a convention memory test system.

(b) For testing a memory which incorporates a logical arithmetic function, expected data must be determined from the supplied data of the pattern generator, the written-in data of the memory under test, and the nature of the arithmetic function in this memory. Therefore, generating the expected data for this type of memory is difficult for a conventional test system.

(c) Another type of memory has both a random access port and a serial access port, as illustrated in FIG. 9. A RAM unit 27 is accessed through the random access port and its operation is identical to dynamic random access memories generally employed. A SAM unit 28 of the memory is accessed by a pointer contained in the memory chip and synchronized by a clock. The pointer is incremented by one as each clock pulse is inputted. Data transfer between the RAM unit 27 and the RAM unit 28 is also possible. The RAM unit 27 functions as a dynamic RAM through the random access port, however, the RAM unit 27 and the SAM unit 28 can also function independently and asynchronously.

For testing the type of memory which has both a random access port and a serial access port as described above, address and data signals have to be provided simultaneously and independently to the RAM unit 27 and the SAM unit 28. Since there is only one set of address and data generators in the conventional pattern generator 11 of a conventional test system, such generation is not possible. Even if the data memory 23 is utilized to generate data, an address from the address generator 21 is needed to access the memory. And if this address is used for the SAM unit 28, it has to be generated in sequential order; thus, address generation for the RAM unit 27, which needs random address generation, is not available.

(d) In a FIFO memory, a write-in address and a read-out address of the FIFO memory having a write-in pointer and a read-out pointer are determined by each pointer, and these pointers are incremented by a write-in clock and a read-out clock respectively. for testing the memory of this kind, the addresses have to be determined by the write-in pointer and the read-out pointer during the write-in and the read-out operations respectively. However, in the conventional memory test system there is only one kind of address generating unit for accessing the data memory 23 for generating the expected data pattern. Therefore, in a conventional test system, it is not possible to generate the address for the read-out pointer while simultaneously generating the address for the write-in pointer.

SUMMARY OF THE INVENTION

An object of this invention is to provide a semiconductor memory test for high accuracy testing of semiconductor memories.

It is another object of this invention to provide a high accuracy testing for different varieties of semiconductor memories.

According to this invention, address signals generated by a modified pattern generator are provided to a memory under test, which is composed so that data is supplied and written-in to this memory in the same way as in the conventional system. In addition, the pattern generator accesses a buffer memory using the above address signals and writes the identical data into the buffer memory. That is, the same data is stored at the same location both in the buffer memory and the memory under test. When reading-out an address from the memory under test, the same address is also read out from the buffer memory and is used as expected data for comparison with read-out data from the memory under test in a logic comparator.

For testing a memory in which arbitrary bits can be inhibited from having data written-in, it is sufficient to utilize a buffer memory which has control terminals so that it can selectively read and write the write-in data for each bit. Further, in instances where the memory under test contains a mask register and thus write-in for each bit depends upon the contents of the mask register, a mask register is also provided to the buffer memory and stores therein the same mask data as stored in the mask register of the memory under test. In addition, the mask data and an input write-in control signal are supplied to AND gates and outputs of the AND gates are connected to write-in control terminals of the buffer memory. Therefore, write-in prevention for each bit of the buffer memory would be executed in the same manner as for the memory under test, using the above procedures.

In order to test a memory internalizing an arithmetic function device, first, an arithmetic function unit is provided between the buffer memory and the pattern generator and connected in series with the data input terminal of the buffer memory; secondly, write-in data for the memory under test is also provided to a first input terminal of the arithmetic function unit, while read-out data from the buffer memory is simultaneously provided to a second input terminal of the arithmetic function unit; and thirdly, the arithmetic operation is carried out and the result is stored in the buffer memory.

In order to test a memory with random and serial access ports, a multiplexer and a counter are provided at the address input of the buffer memory. The counter sets an address so that a pointer identical to a pointer in the memory under test can be set and is incremented by a clock. A multiplexer selects either the contents of the counter or the address supplied to the memory under test from the address generator and provides its selection to the buffer memory as an address. When randomly accessing the memory under test, the buffer memory is also provided with the same random address through the multiplexer. On the other hand, when accessing the memory under test serially through the serial access port, the counter provides the buffer memory with a serial address, beginning with the address indicated by the pointer, and which is then incremented by the clock.

In instances where the memory under test operates both write-in and read-out functions at the same time, an additional multiplexer and a buffer memory pair is provided so that one pair is used for write-in while the other pair is used for read-out, and both operations can be conducted simultaneously.

In order to test a FIFO memory which has a write-in pointer and a read-out pointer, a multiplexer and two counters are provided between the pattern generator and the buffer memory so that the multiplexer can select from three sources, that is, the contents of the two counters and the address from the address generator, for allowing access to he buffer memory. Each counter stores an address which is identical to the address in one of the pointers for the memory under test. More specifically, the write-in pointer address is set in one counter and the read-out pointer address is set in the other counter. Those counters are driven by a write-in clock and/or read-out clock of the memory under test so that exactly the same write-in and read-out operation as the memory under test is executed in the buffer memory.

These together with other objects and advantages of the invention will become more apparent from the following descriptions, reference being had to the accompanying drawings wherein like reference numerals designate the same or similar parts throughout.

BRIEF DESCRIPTION OF THE DRAWINGS

FIG. 1 is a block diagram of a conventional semiconductor memory test system;

FIG. 2 is a block diagram showing a basic embodiment of a semiconductor memory test system according to the present invention;

FIG. 4 is another block diagram showing a modification of the test system according to FIG. 3;

FIG. 9 is a block diagram illustrating a semiconductor memory which has a random access port and a serial access port.

DETAILED DESCRIPTION OF THE PREFERRED EMBODIMENTS

Figure 3:
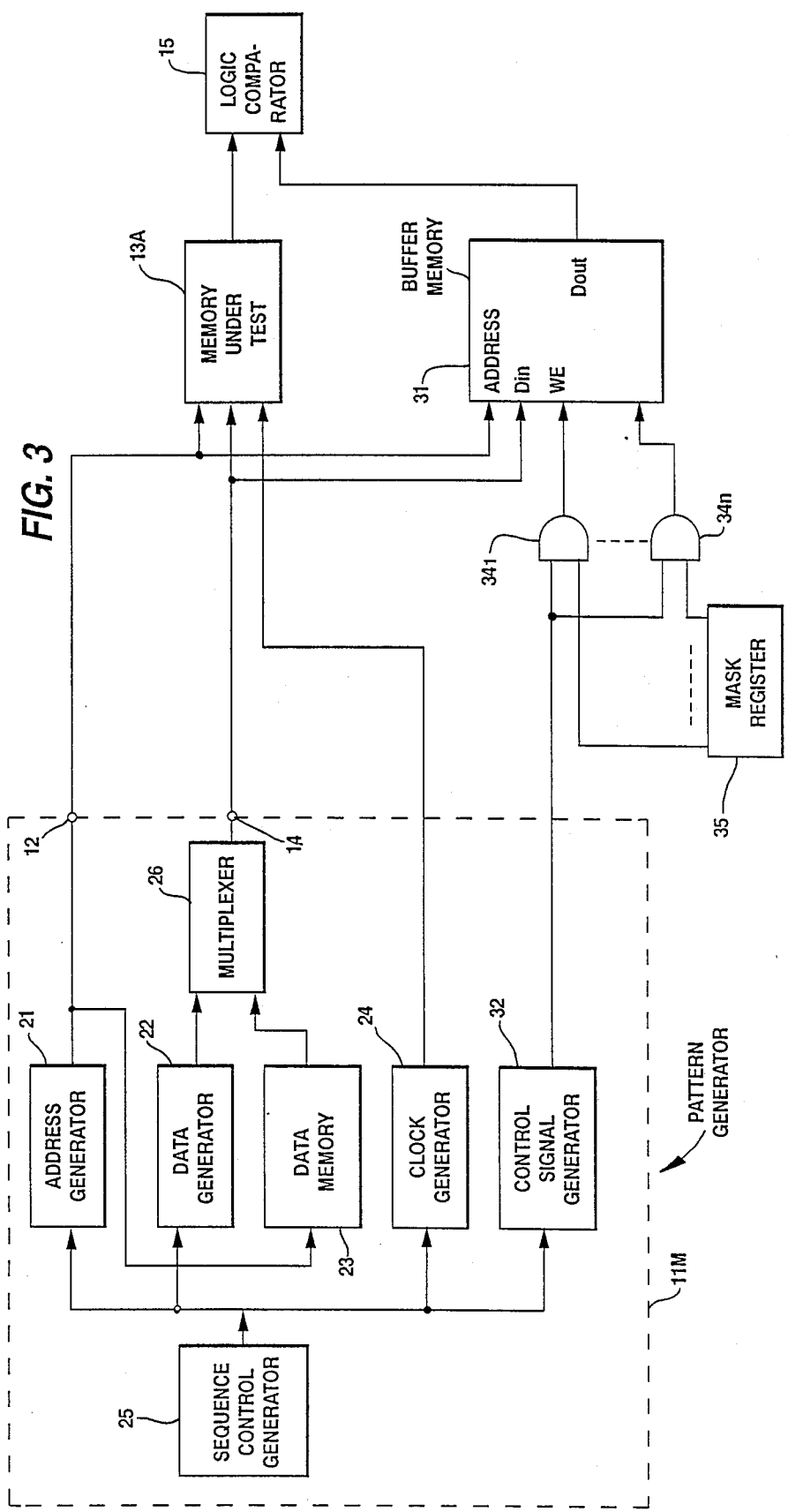
FIG. 3 is a block diagram of the test system according to the present invention for testing a memory which prevents write-in for selected bits.

FIG. 2 illustrates a basic structure of this invention. Some parts corresponding to FIG. 1 are indicated by the same reference numerals, and function as indicated above.

In this invention, a buffer memory 31 with the same or greater memory capacity than a memory 13 to be tested is provided, as well as a control signal generator 32 along with the previously described elements in a modified pattern generator 11M.

The control signal generator 32 is controlled by a sequence control unit 25. Its function is to generate control signals for the buffer memory 31. The buffer memory 31 can change its structure depending on the structure of the memory 13 under test. That is, for example, the buffer memory 31 is of a one word bit structure when the test memory 13 is one word one bit, and a one word four bit structure when the test memory 13 is one word four bit.

Exactly the same data and address signals are provided to both the buffer memory 31 and the test memory 13; therefore, exactly the same data should be stored in the same address of both the buffer memory 31 and the test memory 13. During a read process, the test memory 13 and the buffer memory 31 are accessed by address signals generated by the pattern generator 11M. Thereafter, read-out data of the test memory 13 is compared with expected data read-out from the buffer memory 31 at a logic comparator 15 for determining whether the memory 13 under test functions properly.

EXAMPLE A

FIG. 3 shows a block diagram for testing a memory 13A that can inhibit the writing-in of arbitrary bits. In this example, AND gate $34_1$-$34_n$ are provided, one corresponding to each write enable terminal of the buffer memory 31. The data and address signals are supplied commonly both to the buffer memory 31 and the memory 13A during the writing-in process. A mask register 35 stores mask data which is identical to the data stored in the memory 13A for inhibiting arbitrary bits from being written-in. That is, bits restricted from being written over are indicated in the mask register 35 and a "0", and unrestricted bits are indicated as a "1". A write-in to buffer memory 31 is unable to occur into a bit for which a "0" is set in the mask register 35 because a write enable signal is not provided through its corresponding AND gate. However, for a bit for which a "1" is set in the mask register, write-in will occur, since during any write-in process the control signal generator 32 will be generating a "1". Thus, both inputs for the corresponding AND gate will be a "1", and the AND gate will output a "1" to the write enable terminal for that bit.

As a result, exactly the same data is stored in both the memory 13A and the buffer memory 31. The data stored in the buffer memory 31 is used as expected data. In the actual testing of the memory 13A, the logic comparator 15 compares the data read out of test memory 13A with the expected data read-out of buffer memory 31. If a difference is discovered between the sets of data, the memory 13A under test is rejected as defective.

EXAMPLE B

In another type of semiconductor memory 13B, the writing-in for arbitrary selected bits is not inhibited by the data stored in a mask memory but by data supplied in real time to the memory 13B. FIG. 4 is a block diagram illustrating a system for testing a memory of this type. Shown in FIG. 4 are the modifications necessary from the system of FIG. 3. The pattern generator 11M provides data via the multiplexer 26 and through the data terminal 14 which determines whether or not to inhibit write-in for each bit to the AND gates corresponding to each bit. During a write-in process, the control signal generator 32 will generate a "1" as a write enable signal. So during a write-in process, any bit for which the pattern generator 11M sends a "1" (write signal) to the corresponding AND gate, data will be written-in. For any bit that the pattern generator 11M sends a "0" (inhibit signal) to its corresponding AND gate, data will not be written-in.

In this situation, data inputted to the buffer memory 31 would be the same as that inputted into the memory 13B under test. Thus the logic comparator 15 may test this type of memory 13B in the same way as for the test memory 13A in Example A above.

EXAMPLE C

Figure 5:
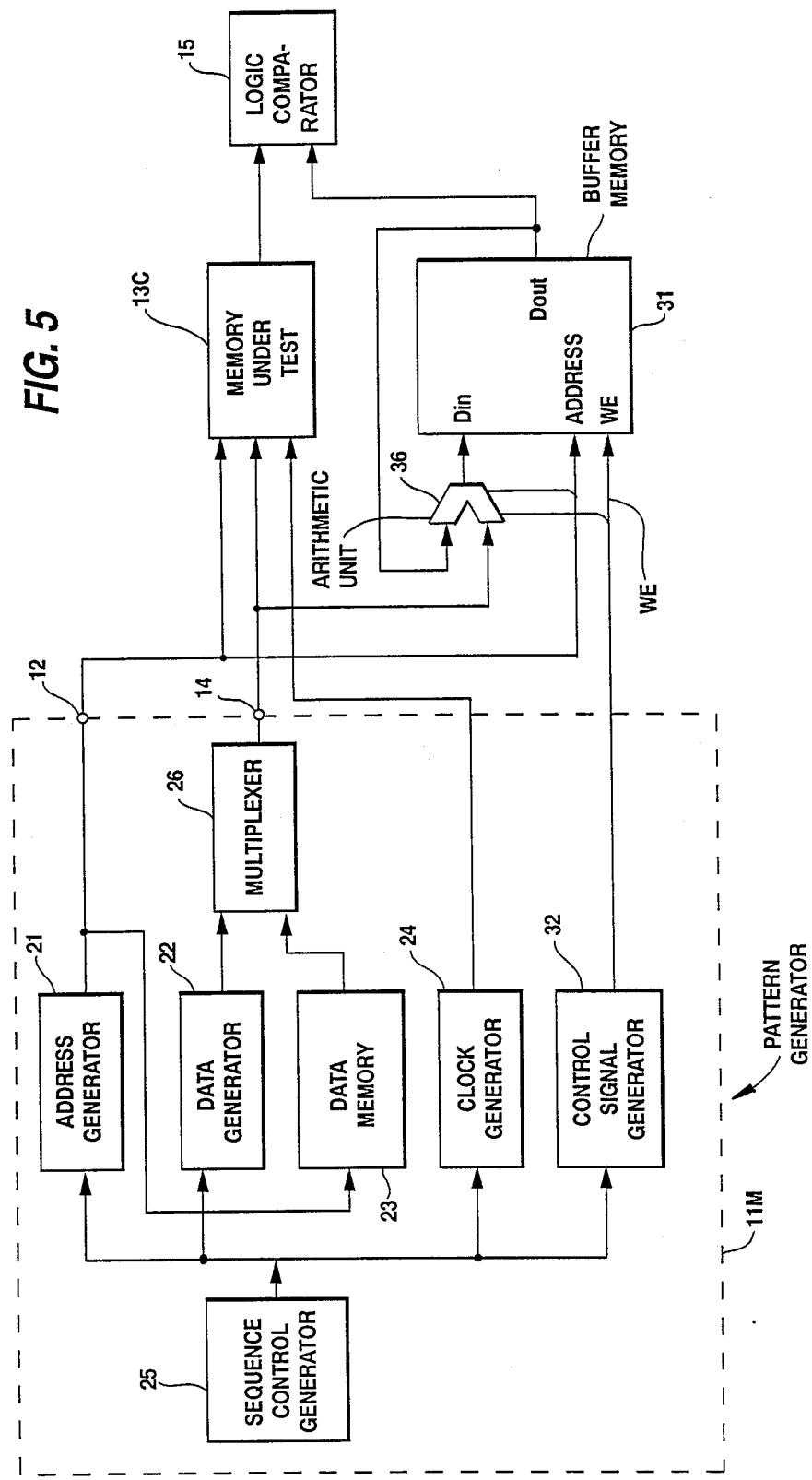
FIG. 5 is a block diagram illustrating a memory test system for testing a memory which internalizes computational functions.

FIG. 5 illustrates a block diagram of a testing system for a memory 13C which internalizes a calculating function. Data from the pattern generator 11M and read-out data from the buffer memory 31 are inputted to an arithmetic function unit 36, the output of which is connected to the data input terminal of the buffer memory 31. The result of an arithmetic operation is then written-in to the buffer memory 31.

The same address generated by the address generator 21 of the pattern generator 11M is supplied to both the memory 13C and the buffer memory 31. Also data from the data terminal 14 that is generated by the pattern generator 11M is provided to both the memory 13C and the arithmetic funtion unit 36. The address signal from the address generator 21 via the address terminal 12 contains information for setting a mode of operation for an arithmetic unit embedded in the memory 13C being tested. As shown in FIG. 5, the address signal is also supplied to the arithmetic function unit 36 to set it to the same arithmetic mode as that of the internalized arithmetic unit of the memory 13C. The output signal from the control signal generator 32 determines whether it is time for the arithmetic function unit 36 to operate. The data resulting from the operation of arithmetic function unit 36 is stored in the buffer memory 31. As a result, the contents of the buffer memory 31 and the memory 13C should be identical.

Therefore, by accessing the memory 13C and the buffer memory 31 with the same address and comparing the read-out data in the logic comparator 15, the testing of the memory 13C which contains an arithmetic function is accomplished.

EXAMPLE D

Figure 6:
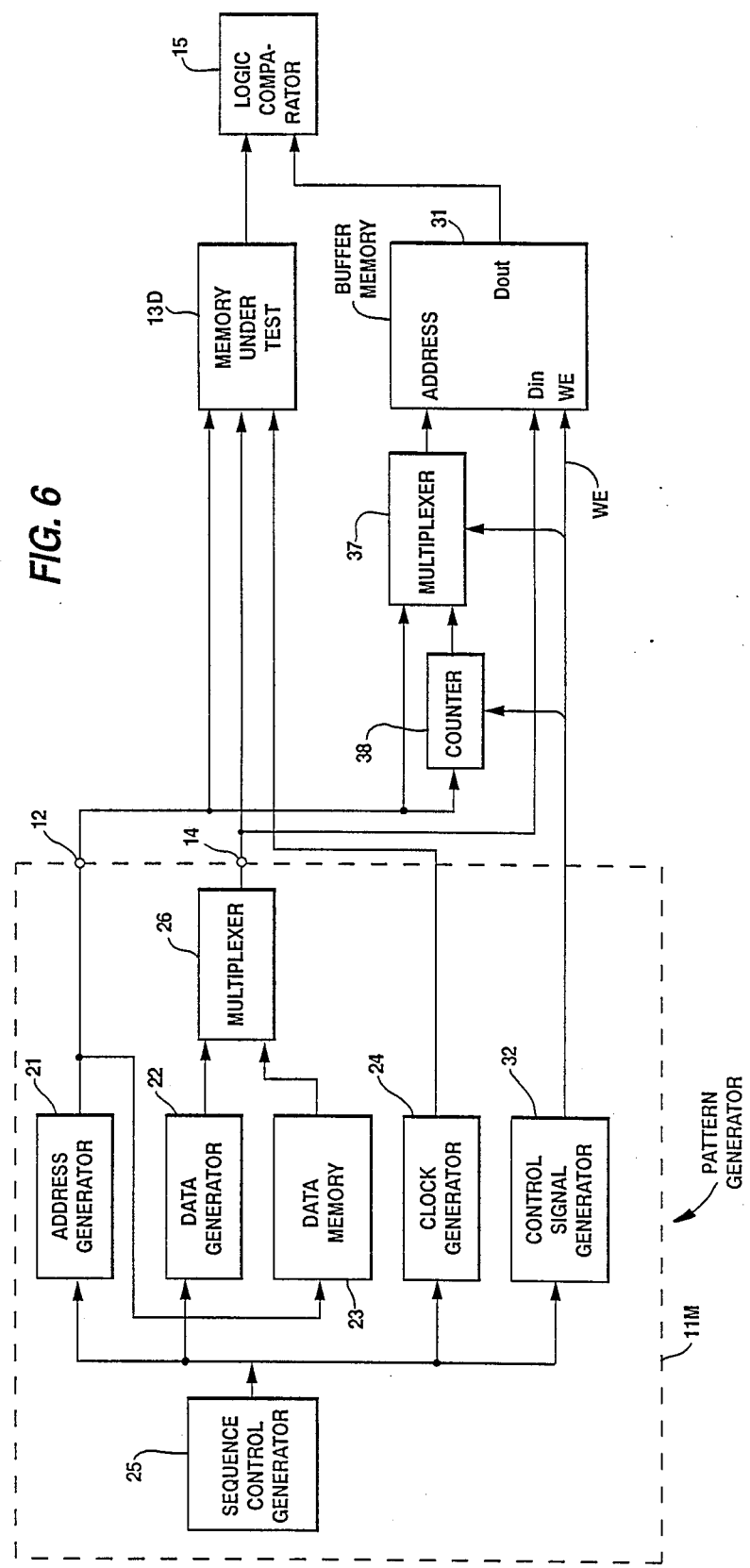
FIG. 6 is a block diagram which illustrates a memory test system for testing a memory with a random access port and a serial access port.

FIG. 6 is a block diagram which illustrates the testing of a memory 13D, which has a random access port and a serial access port as shown in FIG. 9. A memory system of this type consists of a random access memory (RAM) unit 27 and a serial access memory (SAM) unit 28, and is able to transfer stored data between the two memories.

In FIG. 6, a multiplexer 37 is connected in series with the address input terminal of the buffer memory 31. A counter 38 is connected to one of the input terminals of the multiplexer 37. The counter 38 has the ability to load an address that is generated by the address generator 21 of the pattern generator 11M and increment, decrement, and preserve the address. The multiplexer 37 selects either the address from the address generator 21 of the pattern generator 11M or the counter 38 to provide to the buffer memory 31.

The counter 38 is controlled by a counter control signal, and the multiplexer 37 is controlled by a multiplexer control signal. Both signals are generated by the control signal generator 32 of the pattern generator 11M.

The SAM unit 28 of the memory 13D being tested is accessed serially by a pointer included in the memory 13D. The initial address of this pointer is determined by address signals from the address generator 21, and the pointer can then be incremented by a clock signal. Thus, the identical initial address is set in the counter 38 and the pointer.

When the address and data signals are supplied from the pattern generator 11M to the RAM unit 27 of the memory 13D, the address signal passes through the multiplexer 37 to access the buffer memory 31, and the same data signal is simultaneously supplied to the buffer memory 31. After this procedure, data in the RAM unit 27 is transferred to the SAM unit 28 in the memory 13D. A pointer of the SAM unit 28 of the memory 13D is set internally by the address from the address generator 21 of the pattern generator 11M, therefore the serial address is also set simultaneously in the counter 38 by the same address. The counter 38 accesses the buffer memory 31 to generate expected data for comparing with the read-out data from the SAM unit 28 of the memory 13D. Therefore, testing a memory of this kind can be accomplished.

EXAMPLE E

Figure 7:
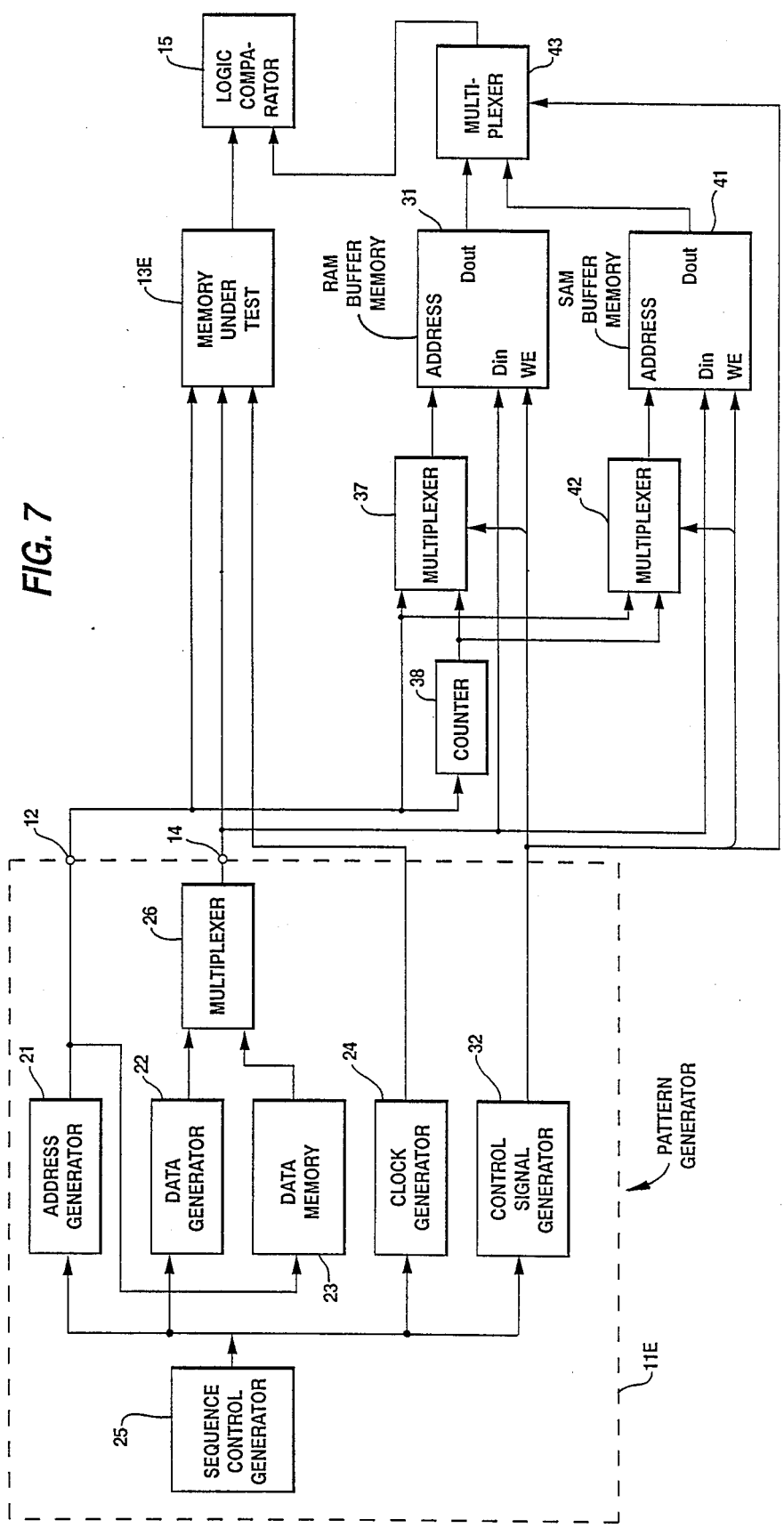
FIG. 7 is a block diagram illustrating another embodiment of the memory test system for testing a memory that has both random and serial access ports.

It is possible for a memory 13E with a random access port and a serial access port to control each port separately. For instance, the SAm unit 28 can be read out independently from the serial access port wile the RAM unit 27 is being written-in at the same time. For testing this type of memory 13E according to this invention, an additional buffer memory and multiplexer set is provided. A second buffer memory 41 and a second multiplexer 42 are added as shown in FIG. 7, supplementing the first buffer memory 31 and the first multiplexer 37.

Also added is third multiplexer 43 for selecting, based on control signals from the control signal generator 32, between data outputs of the buffer memories 31, 41 for supplying to the logic analyzer 15.

To test the memory 13E when it is reading out from the serial access port and simultaneously writing-in data from random access port, the counter 38 acceses the second buffer memory 41 through the second multiplexer 42 to read out expected data for the serial port data. The read out data is supplied via the third multiplexer 43 to the logic comparator 15 for comparison with the read out data from the serial access port. At the same time, the address signal from the address generator 21 accesses the memory 13E through the random access port as well as the first buffer memory 31 through the first multiplexer 37. Thus, the same data should be written into the same address location for both the memory 13E and the buffer memory 31. These two sets of data will also be read out and compared for determining whether the memory 13E functions properly.

EXAMPLE F

Figure 8:
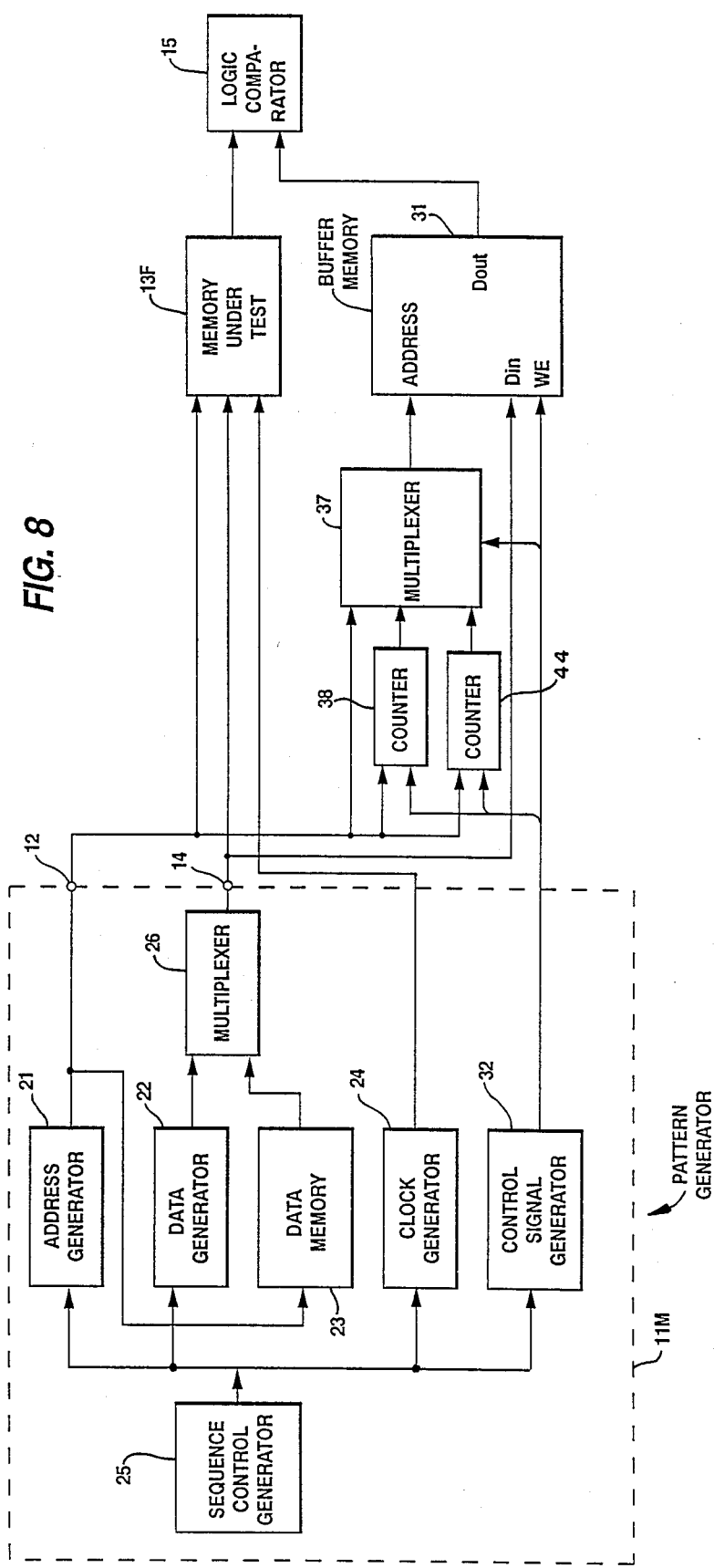
FIG. 8 is a block diagram of the test system for a FIFO memory which has a write-in pointer and a read-out pointer.

A block diagram of the test system for a FIFO memory with a write-in pointer and a read-out pointer is illustrated in FIG. 8. A second counter 44 is added in this embodiment to the embodiment shown in FIG. 6, and the second counter 44 and the first counter 38 are controlled to function independently by control signals from the control signal generator 32. The multiplexer 37 selects either the address from the address generator 21 of the pattern generator 11M, the first counter 38, or the second counter 44 to provide to the buffer memory 31.

The address from the pattern generator 11M is stored in the first counter 38 when a write-in pointer of the memory 13F is changed to the initial stage, and the address from the pattern generator 11M is stored in the second counter 44 when a read-out pointer is also changed to the initial stage. When a write-in clock pulse is provided to the memory 13F, the multiplexer 37 selects the address in the first counter 38 to write into the buffer memory 31 during write-in procedures. On the other hand, when a read-out clock pulse is provided to the test memory 13F, the multiplexer 37 this time selects the address in the second counter 44 with which to access the buffer memory 31. The outputs of the buffer memory 31 are compared with the outputs of the memory 13F at the logic comparator 15. As the stored data should be identical, the memory 13F is rejected if a difference is found.

In the above procedures, the address would be generated by the pattern generator 11M only when the first counter 38 and the second counter 44 are changed to the initial stage. That is, it is not necessary for the pattern generator 11M to generate an address when a write-in clock pulse and a read-out clock pulse are provided to the memory 13F.

According to this invention of the semiconductor memory testing device, a buffer memory is accessed by the testing device with the same address as the one used to access the memory under test. In addition, by properly composing the write-in data or corresponding data of the memory under test, it is possible to write into the buffer memory under the same conditions and thus with the same data as for the memory under test. The testing of memories having various functions is possible in accordance with the present invention as described above. Therefore, since numerous modifications and changes will readily occur to those skilled the art, it is not desired to limit the invention to the exact construction and applications shown and described and accordingly, all suitable modifications and equivalents may be resorted, falling within the scope of the appended claims and their equivalents.

We claim:

1. A semiconductor test system for testing a semiconductor memory wherein the semiconductor memory internalizes an arithmetic unit, comprising:
   a sequence control unit for generating sequence control signals;
   an address generator connected to an output of said sequence control unit for generating addresses having an output connected to the semiconductor memory under test;
   a data generator connected to the output of said sequence control unit for generating data;
   a data memory connected to an output of said address generator for storing irregular or random data;
   a clock generator connected to the output of said sequence control unit for supplying clock pulses to the semiconductor memory under test;
   a multiplexer connected to the output of said data generator and said data memory and having an output connected to the semiconductor memory for selecting which data to input to the semiconductor memory under test;
   a buffer memory having an address input connected to the output of said address generator and a data input connected to the output of said multiplexer, for storing identical data at identical addresses as the semiconductor memory under test;
   a control signal generator connected to the output of said sequence control unit and having an output connected to a write enable input terminal of said buffer memory for controlling the writing-in of data into said buffer memory;
   a logic comparator connected to an output of the semiconductor memory under test and an output of said buffer memory for comparing the data stored in the semiconductor memory and the buffer memory for determining whether the semiconductor memory under test functions correctly; and
   an arithmetic function unit having a first input connected to the output of said multiplexer, a second input connected to an output of said buffer memory, an output connected to the data input of said buffer memory, a third input connected to said control signal generator and a fourth input connected to said address generator, wherein a signal from said address generator sets a mode for an operation and a signal from said control signal generator starts the operation, results from the operation are stored in said buffer memory.

2. A semiconductor memory test system for testing a semiconductor memory wherein said semiconductor memory has a random access port and a serial access port and consists of a random access memory unit and a serial access memory unit, comprising:
   a sequence control unit for generating sequence control signals;
   an address generator connected to an output of said sequence control unit for generating addresses having an output connected to the semiconductor memory under test;
   a data generator connected to the output of said sequence control unit for generating data;

a data memory connected to an output of said address generator for storing irregular or random data;

a clock generator connected to the output of said sequence control unit for supplying clock pulses to the semiconductor memory under test;

a multiplexer connected to the output of said data generator and said data memory and having an output connected to the semiconductor memory for selecting which data to input to the semiconductor memory under test;

a buffer memory having an address input connected to the output of said address generator and a data input connected to the output of said multiplexer, for storing identical data at identical addresses as the semiconductor memory under test;

a control signal generator connected to the output of said sequence control unit and having an output connected to a write enable input terminal of said buffer memory for controlling the writing-in of data into said buffer memory;

a logic comparator connected to an output of the semiconductor memory under test and an output of said buffer memory for comparing the data stored in the semiconductor memory and the buffer memory for determining whether the semiconductor memory under test functions correctly;

a counter connected to and controlled by said control signal generator having an input connected to said address signal generator for generating an address identical to an address used by the serial access memory unit of the semiconductor memory; and a second multiplexer connected to and controlled by said control signal generator having a first input connected to said address signal generator, a second input connected to said counter and an output connected to the address input of said buffer memory, for selecting between the address from said address signal generator and the address held in said counter for supply to said buffer memory.

3. A semiconductor memory test system for testing a semiconductor memory according to claim 2, wherein the semiconductor memory has a random access memory and a serial access port and corresponding random access port and serial access memory which can be independently controlled, said system further comprising:

a third multiplexer controlled by said control signal generator having a first input connected to said address generator and a second input connected to said counter, for selecting between the address supplied by said address generator and the address held in said counter;

a second buffer memory for storing data identical to data stored in the serial access memory of the semiconductor memory, having a write enable terminal connected to the output of said control signal generator, a data input terminal connected to the output of said multiplexer and an address input terminal connected to the output of said third multiplexer, said buffer memory stores data identical to data stored in the random access memory of the semiconductor memory; and a fourth multiplexer controlled by said control signal generator for selecting between the data output by said buffer memory and the data output by said second buffer memory for supplying to said logic comparator.

4. A semiconductor test memory for testing a semiconductor memory wherein the semiconductor memory is a first-in first-out memory having a write-in pointer and a read out pointer, comprising:

a sequence control unit for generating sequence control signals;

an address generator connected to an output of said sequence control unit for generating addresses having an output connected to the semiconductor memory under test;

a data generator connected to the output of said sequence control unit for generating data;

a data memory connected to an output of said address generator for storing irregular or random data;

a clock generator connected to the output of said sequence control unit for supplying clock pulses to the semiconductor memory under test;

a multiplexer connected to the output of said data generator and said data memory and having an output connected to the semiconductor memory for selecting which data to input to the semiconductor memory under test;

a buffer memory having an address input connected to the output of said address generator and a data input connected to the output of said multiplexer, for storing identical data at identical addresses as the semiconductor memory under test;

a control signal generator connected to the output of said sequence control unit and having an output connected to a write enable input terminal of said buffer memory for controlling the writing-in of data into said buffer memory;

a logic comparator connected to an output of the semiconductor memory under test and an output of said buffer memory for comparing the data stored in the semiconductor memory and the buffer memory for determining whether the semiconductor memory under test functions correctly;

a first counter, controlled by said control signal generator and corresponding to the write-in pointer of the semiconductor memory, having an input connected to said address generator;

a second counter, controlled by said control signal generator and corresponding to the read out pointer of the semiconductor memory, having an input connected to aid address generator; and a second multiplexer having a first input connected to said address generator, a second input connected to said first counter, and a third input connected to said second counter, controlled by said control signal generator, for selecting an address to supply to the address input of said buffer memory.

* * * * *